(12) United States Patent
Kim et al.

(10) Patent No.: US 12,069,196 B2
(45) Date of Patent: Aug. 20, 2024

(54) ELECTRONIC DEVICE COMPRISING SHIELDING MEMBER COMPRISING RECESS FOR CONTAINING ADHESIVE MATERIAL

(71) Applicant: Samsung Electronics Co., Ltd., Gyeonggi-do (KR)

(72) Inventors: Minkuk Kim, Gyeonggi-do (KR); Soobum Lee, Gyeonggi-do (KR); Baekeun Cho, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 627 days.

(21) Appl. No.: 17/282,399

(22) PCT Filed: Oct. 8, 2019

(86) PCT No.: PCT/KR2019/013195
§ 371 (c)(1),
(2) Date: Apr. 2, 2021

(87) PCT Pub. No.: WO2020/076054
PCT Pub. Date: Apr. 16, 2020

(65) Prior Publication Data
US 2021/0352169 A1    Nov. 11, 2021

(30) Foreign Application Priority Data

Oct. 8, 2018    (KR) ........................ 10-2018-0119911

(51) Int. Cl.
*H05K 9/00*    (2006.01)
*H04M 1/02*    (2006.01)
*H05K 5/03*    (2006.01)

(52) U.S. Cl.
CPC ....... *H04M 1/0277* (2013.01); *H04M 1/0266* (2013.01); *H05K 9/0028* (2013.01); *H05K 9/0032* (2013.01); *H05K 5/03* (2013.01)

(58) Field of Classification Search
CPC .......................... H04M 1/0277; H04M 1/0266; H05K 9/0028; H05K 9/0032; H05K 5/03; H05K 9/0024; C09J 9/02
See application file for complete search history.

(56) References Cited

U.S. PATENT DOCUMENTS

| 6,985,366 | B2 | 1/2006 | Albayrak et al. |
| 7,259,969 | B2 * | 8/2007 | Zarganis ................ H05K 9/003 |
| | | | 361/800 |
| 7,383,977 | B2 | 6/2008 | Fagrenius et al. |
| 8,199,527 | B2 | 6/2012 | Muranaga |
| 8,629,355 | B2 | 1/2014 | Kwon et al. |
| 9,018,542 | B2 | 4/2015 | Kwon et al. |
| 9,179,537 | B2 | 11/2015 | Rappoport |

(Continued)

FOREIGN PATENT DOCUMENTS

| KR | 10-2011-0073663 A | 6/2011 |
| KR | 10-2011-0090793 A | 8/2011 |
| KR | 10-2018-0094831 A | 8/2018 |

OTHER PUBLICATIONS

Korean Office Action dated Oct. 19, 2022.

*Primary Examiner* — Anthony Q Edwards
*Assistant Examiner* — Hung Q Dang
(74) *Attorney, Agent, or Firm* — Cha & Reiter, LLC

(57) ABSTRACT

An electronic device is disclosed. The electronic device may comprise: a housing; a substrate disposed inside the housing and comprising a first electric element and an adhesive material; and a shielding material fixed to the substrate by the adhesive material, the shielding member having a shielding space formed therein, the first electric element being disposed in the shielding space. The shielding member may comprise: a plate facing the substrate; and a side wall formed between the plate and the substrate so as to connect the plate and the substrate, the side wall extending in a peripheral direction so as to surround the shielding space. The adhesive (Continued)

material may be disposed on the substrate so as to surround at least a part of the side wall. The side wall may comprise: an outer surface directed toward the shielding space; an inner surface disposed opposite the outer surface; and a bottom surface facing the substrate. The adhesive material has at least a part formed to at least partially cover the outer surface and the inner surface. At least one of the outer surface and the inner surface may have a recess formed therein so as to contain the adhesive material. Various other embodiments understood from the specification are also possible.

12 Claims, 10 Drawing Sheets

(56) References Cited

U.S. PATENT DOCUMENTS

| | | | |
|---|---|---|---|
| 10,220,619 B2* | 3/2019 | Tanaka | B41J 2/1626 |
| 10,856,454 B2* | 12/2020 | Lim | H05K 1/11 |
| 2003/0227760 A1 | 12/2003 | Albayrak et al. | |
| 2005/0254224 A1 | 11/2005 | Fagrenius et al. | |
| 2008/0292846 A1 | 11/2008 | Muranaga | |
| 2011/0155445 A1 | 6/2011 | Kwon et al. | |
| 2012/0281386 A1 | 11/2012 | Kim | |
| 2014/0092578 A1 | 4/2014 | Kwon et al. | |
| 2014/0166350 A1 | 6/2014 | Rappoport | |
| 2018/0116078 A1 | 4/2018 | Mun et al. | |
| 2019/0364695 A1 | 11/2019 | Lee et al. | |

* cited by examiner

【Figure 1】
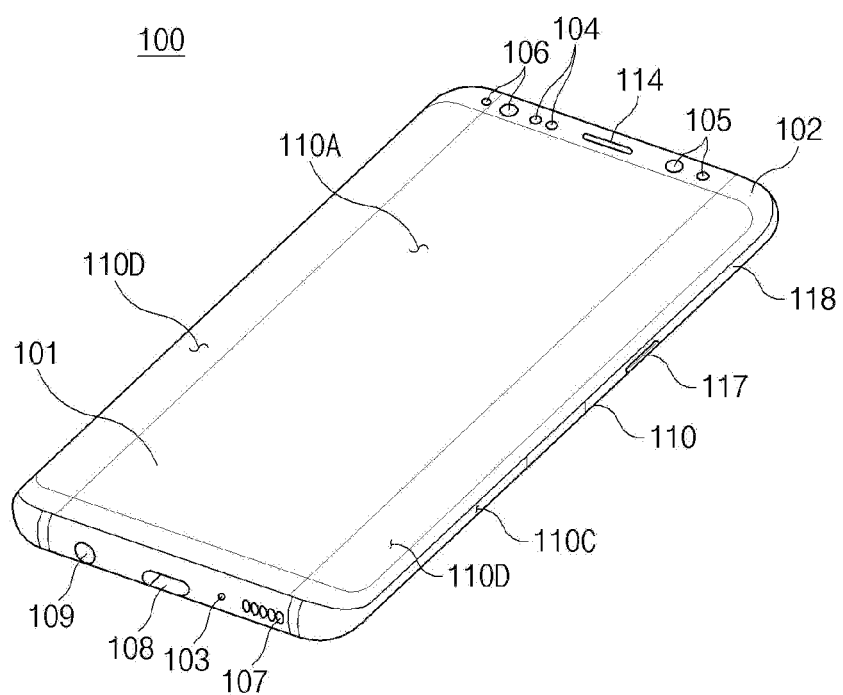

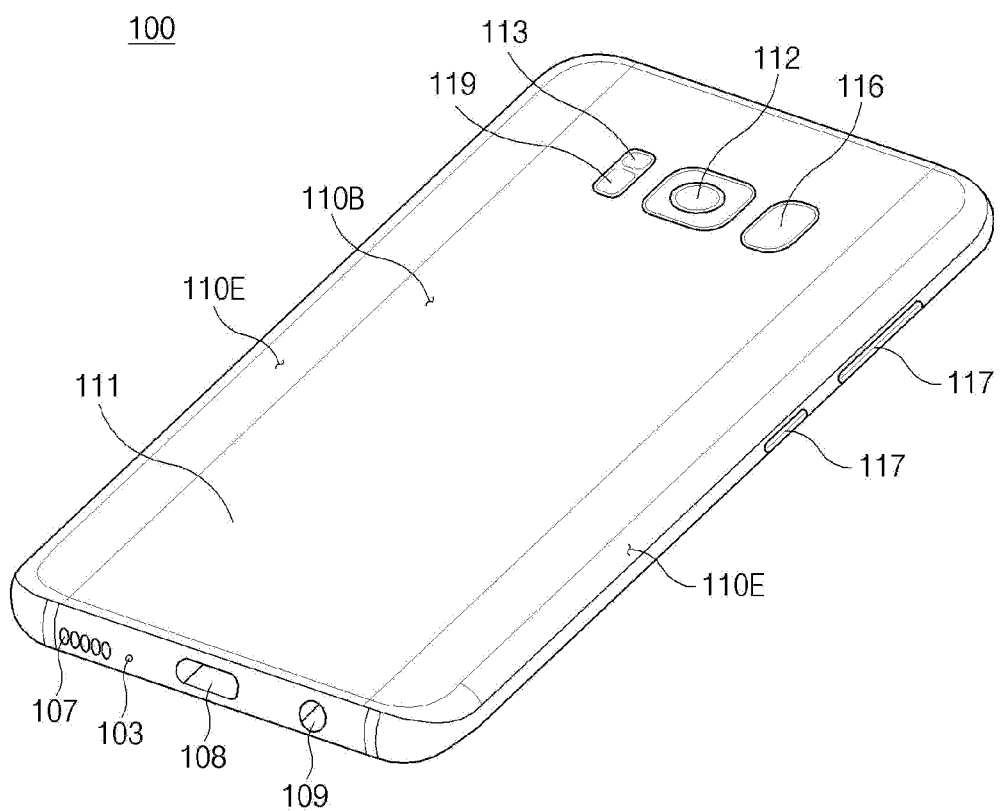
[Figure 2]

【Figure 3】
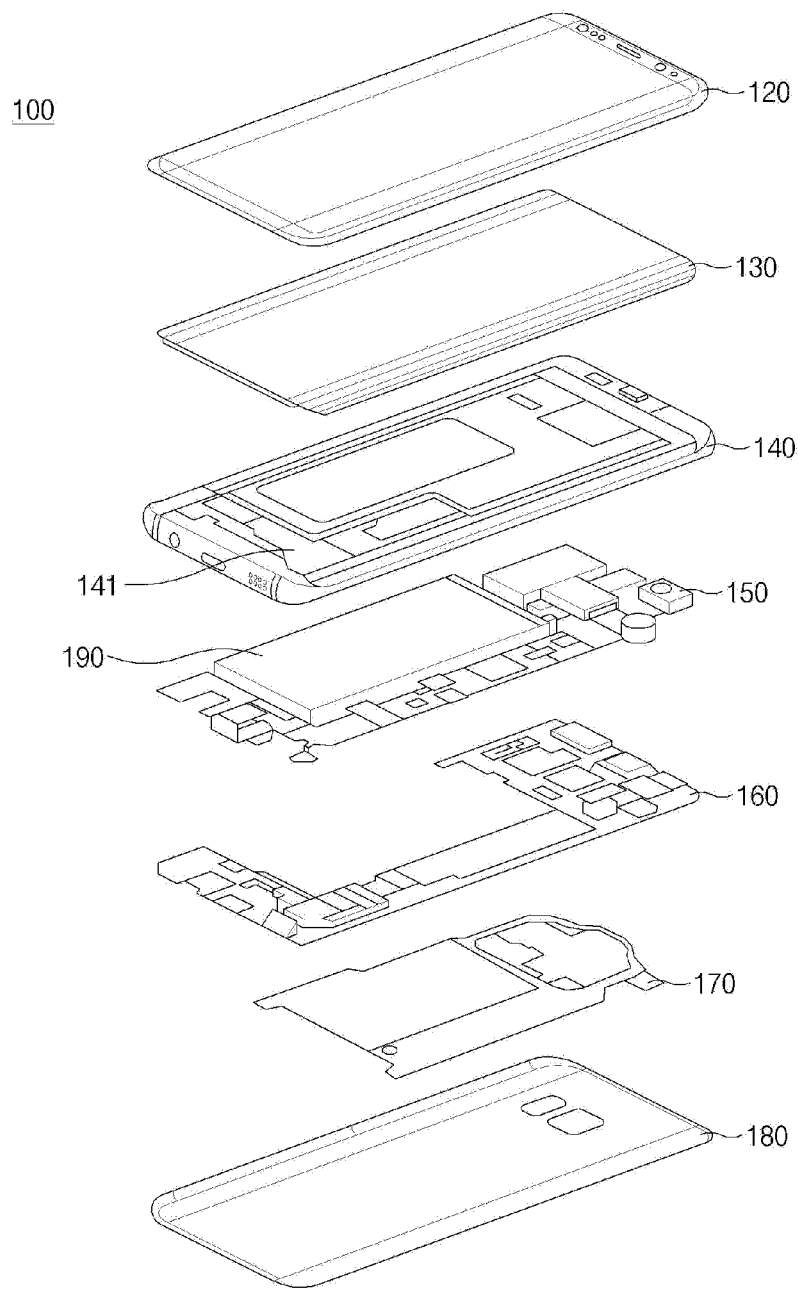

[Figure 4]
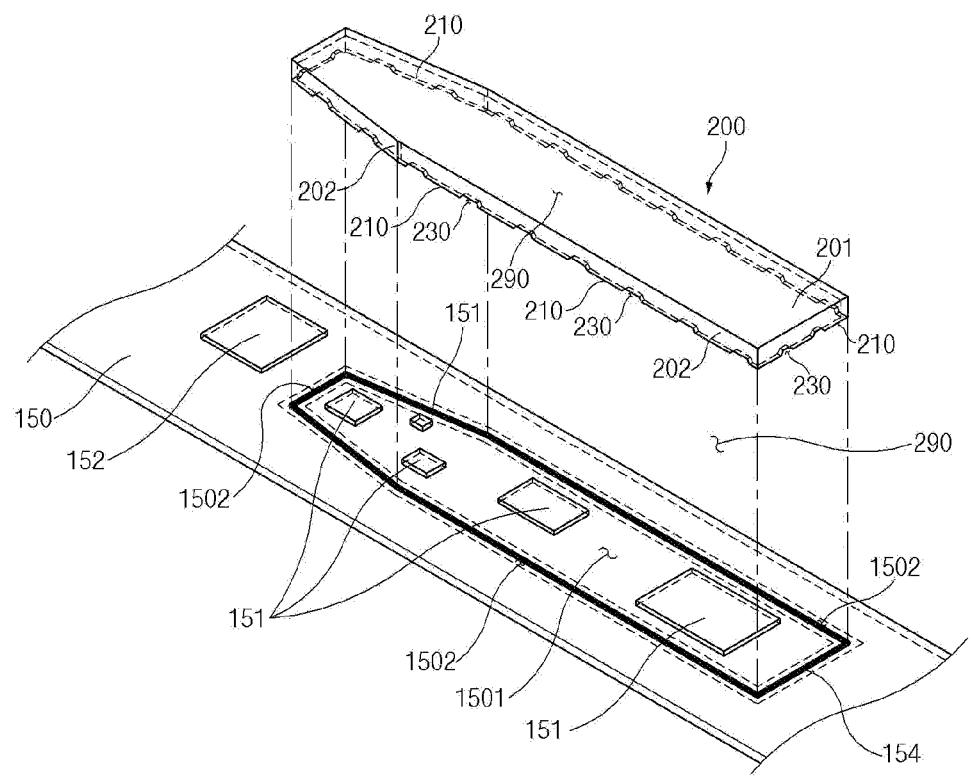

【Figure 5】
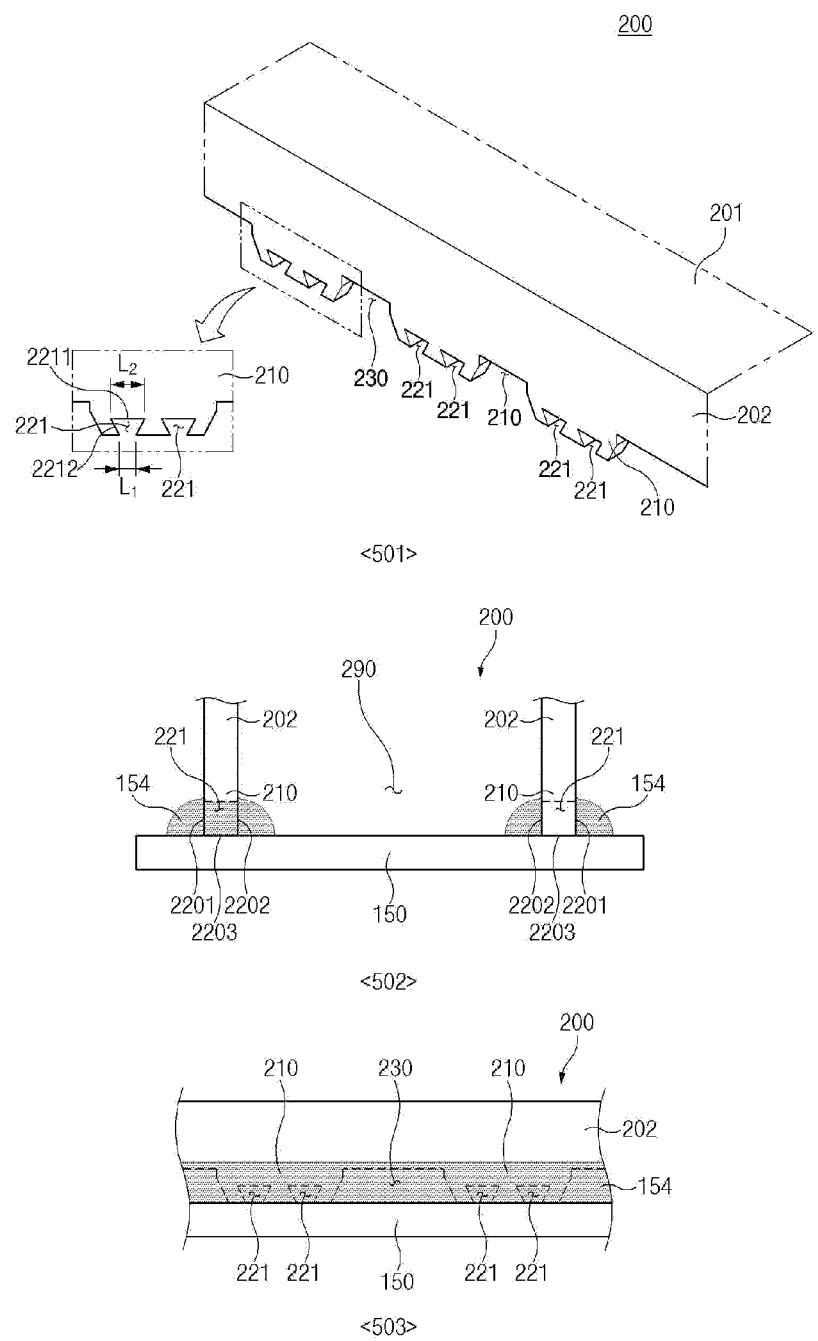

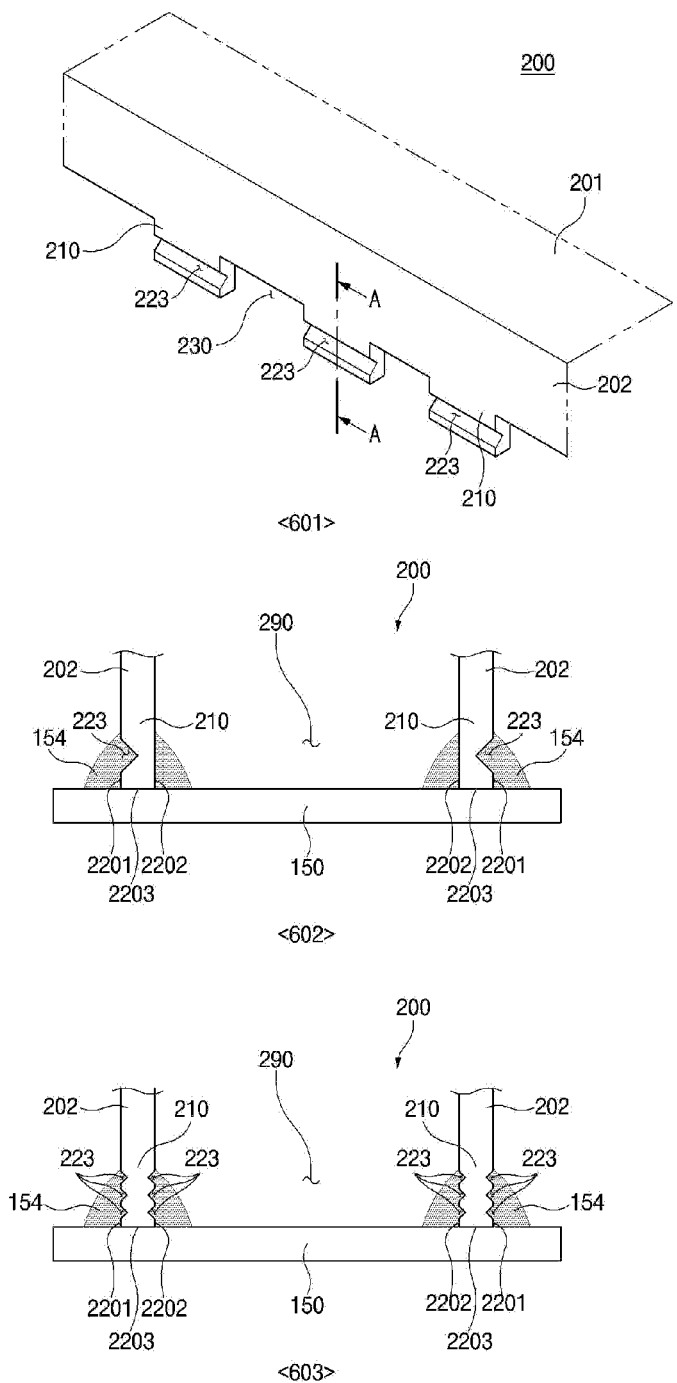
[Figure 6]

[Figure 7]
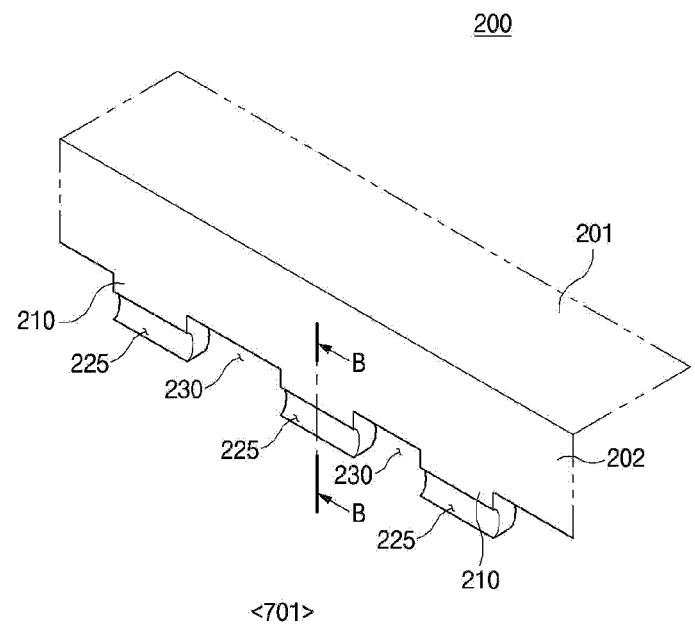
<701>
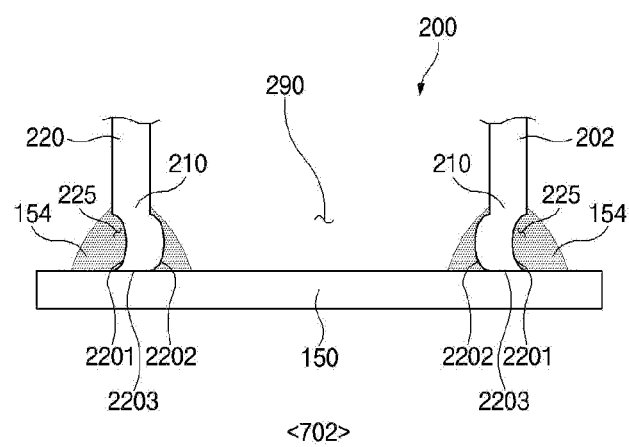
<702>

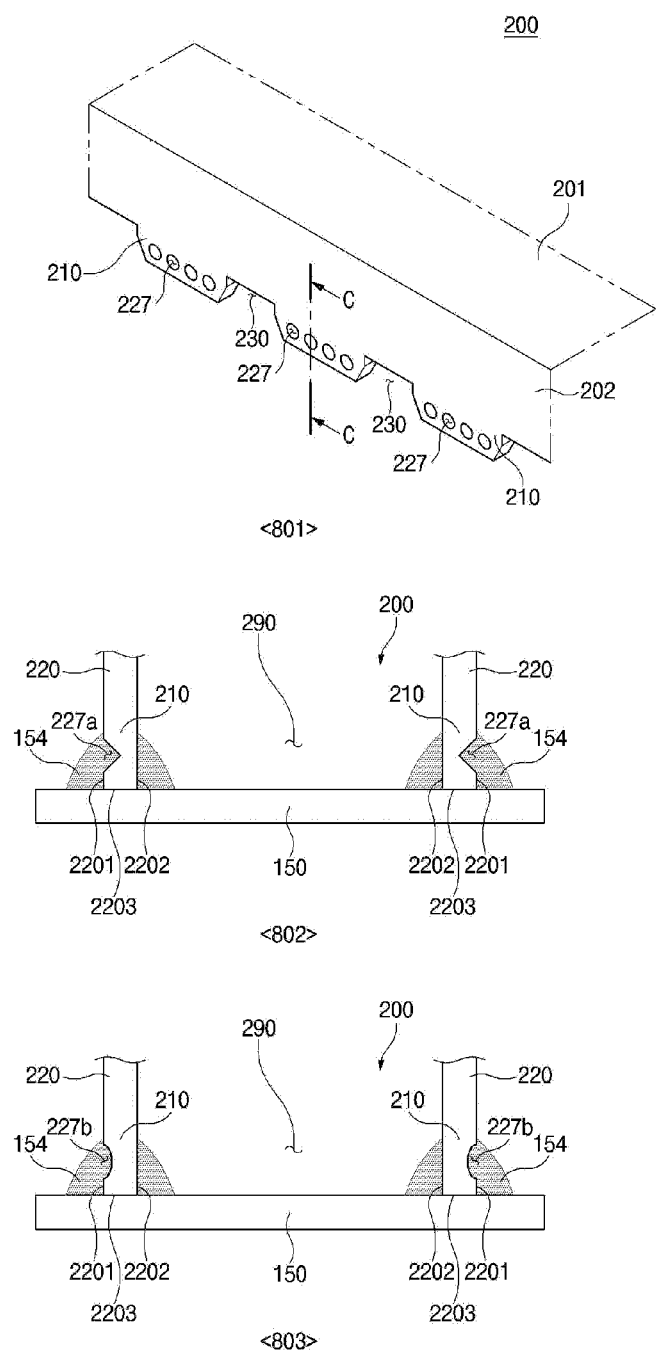
[Figure 8]

[Figure 9]
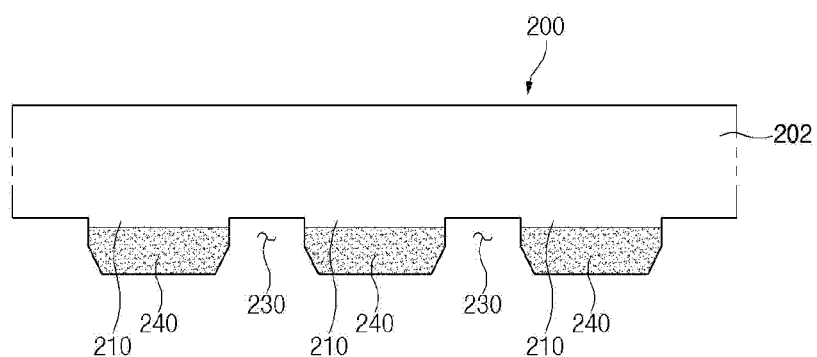

[Figure 10]
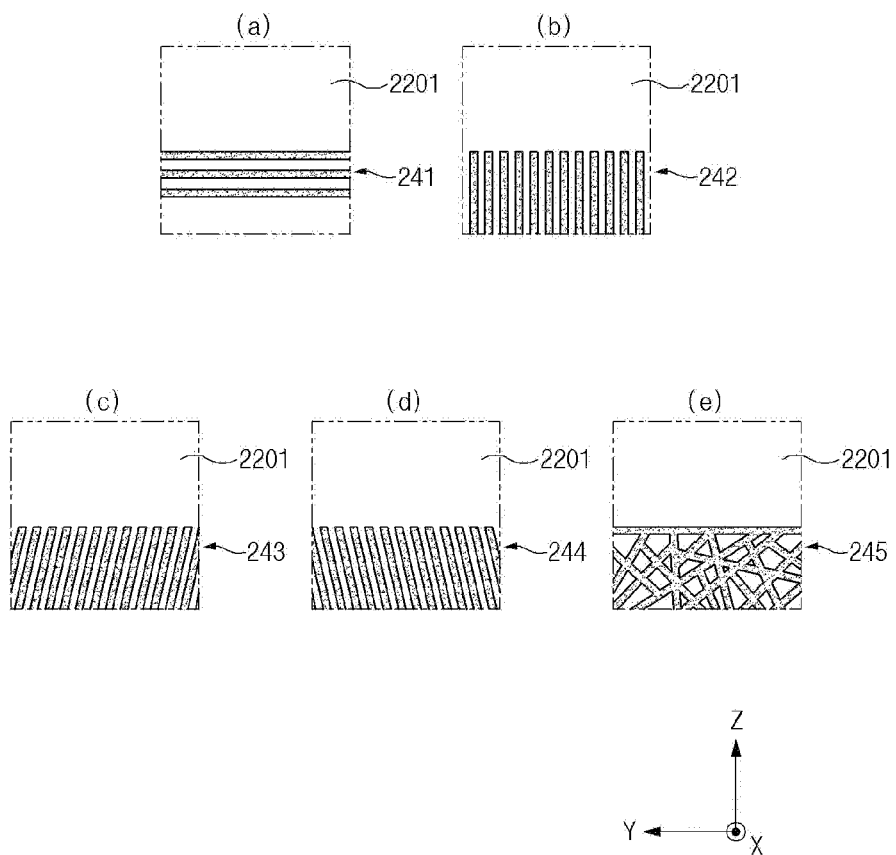

ELECTRONIC DEVICE COMPRISING SHIELDING MEMBER COMPRISING RECESS FOR CONTAINING ADHESIVE MATERIAL

CROSS REFERENCE TO RELATED APPLICATIONS

This application is a National Phase Entry of PCT International Application No. PCT/KR2019/013195, which was filed on Oct. 8, 2019, and claims a priority to Korean Patent Application No. 10-2018-0119911, which was filed on Oct. 8, 2018, the contents of which are incorporated herein by reference.

TECHNICAL FIELD

Embodiments of the disclosure described herein relate to a shielding member including a recess for receiving an adhesive material and an electronic device including the shielding member.

BACKGROUND ART

An electronic device may include a circuit board having electric elements mounted thereon. The electric elements may generate noise, or may be affected by external noise. The electronic device may include electric elements particularly more sensitive to noise generated outside. The electronic device may further include a shielding member for shielding these electric elements. The shielding member may shield noise generated from the electric elements, or may shield an influence of external noise on the electric elements. The shielding member may be fixed to the circuit board by being soldered onto the circuit board.

DISCLOSURE

Technical Problem

When an external impact is applied to the circuit board or the shielding member, the shielding member may be separated from the circuit board. The circuit board may include a pad region on which a solder material is formed and a mounting region on which the electric elements are mounted. When the amount of solder is increased to increase the adhesive force between the circuit board and the shielding member, the pad region may be excessively widened, and therefore the area of the mounting region, on which the electric elements are mounted, may be decreased. Furthermore, when an excessive amount of solder is formed on the pad region, the solder material may overflow into the mounting region to cause a short circuit in an adjacent electric element.

Embodiments of the disclosure provide an electronic device including a shielding member for providing a sufficient adhesive force for a circuit board without a decrease in mounting area of the circuit board.

Technical Solution

An electronic device according to various embodiments includes a housing, a circuit board that is disposed inside the housing and that includes a first electric element and an adhesive material, and a shielding member that is fixed to the circuit board by the adhesive material and that has a shielding space formed therein in which the first electric element is disposed. The shielding member includes a plate that faces the circuit board and a sidewall that is formed between the plate and the circuit board to connect the plate and the circuit board and that extends in a circumferential direction of surrounding the shielding space. The adhesive material is disposed on the circuit board to surround at least part of the sidewall. The sidewall includes an inside surface that faces toward the shielding space, an outside surface opposite to the inside surface, and a bottom surface that faces the circuit board. At least part of the adhesive material covers at least part of the outside surface and at least part of the inside surface. A recess is formed on at least one of the outside surface or the inside surface, and the adhesive material is received in the recess.

An electronic device according to various embodiments includes a housing structure including a first cover, a second cover that faces the first cover, and a side member that surrounds a space between the first cover and the second cover, a display disposed between the first cover and the second cover, a printed circuit board that is disposed between the display and the second cover and that has an electric element mounted thereon, and a shielding member fixed to the printed circuit board by a conductive adhesive material formed on the printed circuit board. The shielding member includes a plate portion that faces the printed circuit board and a sidewall portion that surrounds a shielding space between the plate portion and the printed circuit board. The electric element is disposed in the shielding space. The sidewall portion includes an inside surface that faces toward the shielding space, an outside surface opposite to the inside surface, and a support surface supported by the printed circuit board. One or more recesses are formed on the support surface, and the conductive adhesive material is received in the one or more recesses. The one or more recesses include a bottom surface and inner sidewalls connected to opposite end portions of the bottom surface. A distance between the inner sidewalls decreases from the bottom surface toward the printed circuit board.

Advantageous Effects

The electronic devices according to the embodiments of the disclosure may include the shielding member capable of providing a sufficient adhesive force for the circuit board without a decrease in mounting area of the circuit board. In addition, the disclosure may provide various effects that are directly or indirectly recognized.

DESCRIPTION OF DRAWINGS

FIG. 1 is a front perspective view of a mobile electronic device according to an embodiment.

FIG. 2 is a rear perspective view of the electronic device of FIG. 1.

FIG. 3 is an exploded perspective view of the electronic device of FIG. 1.

FIG. 4 illustrates a circuit board and a shielding member of the electronic device according to an embodiment.

FIG. 5 is a view illustrating a shielding member of the electronic device according to an embodiment.

FIG. 6 is a view illustrating a shielding member of the electronic device according to an embodiment.

FIG. 7 is a view illustrating a shielding member of the electronic device according to an embodiment.

FIG. 8 is a view illustrating a shielding member of the electronic device according to an embodiment.

FIG. 9 is a view illustrating a shielding member of the electronic device according to an embodiment.

FIG. 10 is an enlarged view of a pattern region illustrated in FIG. 9.

With regard to description of the drawings, identical or similar reference numerals may be used to refer to identical or similar components.

MODE FOR INVENTION

Hereinafter, various embodiments of the disclosure may be described with reference to accompanying drawings. Accordingly, those of ordinary skill in the art will recognize that modification, equivalent, and/or alternative on the various embodiments described herein can be variously made without departing from the scope and spirit of the disclosure.

Referring to FIGS. 1 and 2, an electronic device 100 according to an embodiment may include a housing 110 that includes a first surface (or, a front surface) 110A, a second surface (or, a rear surface) 110B, and side surfaces 110C surrounding a space between the first surface 110A and the second surface 110B. In another embodiment (not illustrated), a housing may refer to a structure that forms some of the first surface 110A, the second surface 110B, and the side surfaces 110C of FIG. 1. According to an embodiment, the first surface 110A may be formed by a front plate 102 (e.g., a glass plate including various coating layers, or a polymer plate), at least part of which is substantially transparent. The second surface 110B may be formed by a back plate 111 that is substantially opaque. The back plate 111 may be formed of, for example, coated or colored glass, ceramic, polymer, metal (e.g., aluminum, stainless steel (STS), or magnesium), or a combination of at least two of the aforementioned materials. The side surfaces 110C may be formed by a side bezel structure (or, a "side member") 118 that is coupled with the front plate 102 and the back plate 111 and that contains metal and/or polymer. In some embodiments, the back plate 111 and the side bezel structure 118 may be integrally formed with each other and may contain the same material (e.g., a metallic material such as aluminum).

In the illustrated embodiment, the front plate 102 may include, at opposite long edges thereof, two first regions 110D that curvedly and seamlessly extend from the first surface 110A toward the back plate 111. In the illustrated embodiment (refer to FIG. 2), the back plate 111 may include, at opposite long edges thereof, two second regions 110E that curvedly and seamlessly extend from the second surface 110B toward the front plate 102. In some embodiments, the front plate 102 (or, the back plate 111) may include only one of the first regions 110D (or, the second regions 110E). In another embodiment, a part of the first regions 110D or the second regions 110E may not be included. In the embodiments, when viewed from a side of the electronic device 100, the side bezel structure 118 may have a first thickness (or, width) at sides not including the first regions 110D or the second regions 110E and may have a second thickness at sides including the first regions 110D or the second regions 110E, the second thickness being smaller than the first thickness.

According to an embodiment, the electronic device 100 may include at least one of a display 101, audio modules 103, 107, and 114, sensor modules 104, 116, and 119, camera modules 105, 112, and 113, key input devices 117, a light emitting element 106, or connector holes 108 and 109. In some embodiments, the electronic device 100 may omit at least one component (e.g., the key input devices 117 or the light emitting element 106) among the aforementioned components, or may additionally include other component(s).

The display 101, for example, may be exposed through most of the front plate 102. In some embodiments, at least part of the display 101 may be exposed through the front plate 102 that forms the first surface 110A and the first regions 110D of the side surfaces 110C. In some embodiments, the periphery of the display 101 may be formed to be substantially the same as the shape of the adjacent outside edge of the front plate 102. In another embodiment (not illustrated), the gap between the outside edge of the display 101 and the outside edge of the front plate 102 may be substantially constant to expand the area by which the display 101 is exposed.

In another embodiment (not illustrated), a recess or opening may be formed in part of a screen display area of the display 101, and the electronic device 100 may include at least one of the audio module 114, the sensor module 104, the camera module 105, or the light emitting element 106 that is aligned with the recess or opening. In another embodiment (not illustrated), the electronic device 100 may include, on a rear surface of the screen display area of the display 101, at least one of the audio module 114, the sensor module 104, the camera module 105, the fingerprint sensor 116, or the light emitting element 106. In another embodiment (not illustrated), the display 101 may be combined with, or disposed adjacent to, touch detection circuitry, a pressure sensor for measuring the intensity (pressure) of a touch, and/or a digitizer for detecting a stylus pen of a magnetic field type. In some embodiments, at least a part of the sensor modules 104 and 119 and/or at least a part of the key input devices 117 may be disposed in the first regions 110D and/or the second regions 110E.

The audio modules 103, 107, and 114 may include the microphone hole 103 and the speaker holes 107 and 114. A microphone for obtaining an external sound may be disposed in the microphone hole 103, and in some embodiments, a plurality of microphones may be disposed in the microphone hole 103 to sense the direction of a sound. The speaker holes 107 and 114 may include the external speaker hole 107 and the receiver hole 114 for a telephone call. In some embodiments, the speaker holes 107 and 114 and the microphone hole 103 may be implemented with a single hole, or without the speaker holes 107 and 114, a speaker may be included (e.g., a piezo speaker).

The sensor modules 104, 116, and 119 may generate an electrical signal or a data value that corresponds to an operational state inside the electronic device 100 or an environmental state external to the electronic device 100. The sensor modules 104, 116, and 119 may include, for example, the first sensor module 104 (e.g., a proximity sensor) and/or the second sensor module (not illustrated) (e.g., a fingerprint sensor) that is disposed on the first surface 110A of the housing 110, and/or the third sensor module 119 (e.g., an HRM sensor) and/or the fourth sensor module 116 (e.g., a fingerprint sensor) that is disposed on the second surface 110B of the housing 110. The fingerprint sensor may be disposed not only on the first surface 110A of the housing 110 (e.g., the display 101) but also on the second surface 110B. The electronic device 100 may further include a non-illustrated sensor module, for example, at least one of a gesture sensor, a gyro sensor, an atmospheric pressure sensor, a magnetic sensor, an acceleration sensor, a grip sensor, a color sensor, an infrared (IR) sensor, a biosensor, a temperature sensor, a humidity sensor, or an illuminance sensor 104.

The camera modules 105, 112, and 113 may include the first camera device 105 disposed on the first surface 110A of the electronic device 100, and the second camera device 112 and/or the flash 113 disposed on the second surface 110B. The camera devices 105 and 112 may include one or more lenses, an image sensor, and/or an image signal processor. The flash 113 may include, for example, a light emitting diode or a xenon lamp. In some embodiments, two or more lenses (an IR camera lens, a wide angle lens, and a telephoto lens) and image sensors may be disposed on one surface of the electronic device 100.

The key input devices 117 may be disposed on the side surfaces 110C of the housing 110. In another embodiment, the electronic device 100 may not include all or some of the aforementioned key input devices 117, and the key input devices 117 not included may be implemented in a different form, such as a soft key, on the display 101. In some embodiments, the key input devices may include the sensor module 116 disposed on the second surface 110B of the housing 110.

The light emitting element 106, for example, may be disposed on the first surface 110A of the housing 110. The light emitting element 106, for example, may provide state information of the electronic device 100 in the form of light. In another embodiment, the light emitting element 106 may provide, for example, a light source that operates in conjunction with operation of the camera module 105. The light emitting element 106 may include, for example, an LED, an IR LED, and a xenon lamp.

The connector holes 108 and 109 may include the first connector hole 108 capable of receiving a connector (e.g., a USB connector) for transmitting and receiving electric power and/or data with an external electronic device, and/or the second connector hole (e.g., an earphone jack) 109 capable of receiving a connector for transmitting and receiving audio signals with an external electronic device.

Referring to FIG. 3, the electronic device 100 may include a side bezel structure 140 (e.g., a side member), a first support member 141 (e.g., a bracket), a front plate 120, a display 130, a printed circuit board 150, a battery 190, a second support member 160 (e.g., a rear case), an antenna 170, and a back plate 180. In some embodiments, the electronic device 100 may omit at least one component (e.g., the first support member 141 or the second support member 160) among the aforementioned components, or may additionally include other component(s). At least one of the components of the electronic device 100 may be the same as, or similar to, at least one of the components of the electronic device 100 of FIG. 1 or FIG. 2, and repetitive descriptions will hereinafter be omitted.

The first support member 141 may be disposed inside the electronic device 100 and may be connected with the side bezel structure 140, or may be integrally formed with the side bezel structure 140. The first support member 141 may be formed of, for example, a metallic material and/or a nonmetallic (e.g., polymer) material. The display 130 may be coupled to one surface of the first support member 141, and the printed circuit board 150 may be coupled to an opposite surface of the first support member 141. A processor, a memory, and/or an interface may be mounted on the printed circuit board 150. The processor may include, for example, one or more of a central processing unit, an application processor, a graphic processing unit, an image signal processor, a sensor hub processor, or a communication processor.

The memory may include, for example, a volatile memory or a nonvolatile memory.

The interface may include, for example, a high definition multimedia interface (HDMI), a universal serial bus (USB) interface, an SD card interface, and/or an audio interface. The interface, for example, may electrically or physically connect the electronic device 100 with an external electronic device and may include a USB connector, an SD card/MMC connector, or an audio connector.

The battery 190, which is a device for supplying electric power to at least one component of the electronic device 100, may include, for example, a primary cell that is not rechargeable, a secondary cell that is rechargeable, or a fuel cell. At least part of the battery 190, for example, may be disposed on substantially the same plane as the printed circuit board 150. The battery 190 may be integrally disposed inside the electronic device 100, or may be disposed so as to be detachable from the electronic device 100.

The antenna 170 may be disposed between the back plate 180 and the battery 190. The antenna 170 may include, for example, a near field communication (NEC) antenna, a wireless charging antenna, and/or a magnetic secure transmission (MST) antenna. The antenna 170, for example, may perform short-range communication with an external device, or may wirelessly transmit and receive electric power required for charging. In another embodiment, an antenna structure may be formed by part of the side bezel structure 140 and/or part of the first support member 141, or a combination thereof.

FIG. 4 illustrates a circuit board and a shielding member of the electronic device according to an embodiment. Here, the circuit board may refer to the printed circuit board of FIG. 3.

In an embodiment, the electronic device 100 may include the circuit board 150 (e.g., the printed circuit board 150 of FIG. 3) on which one or more electric elements 151 and 152 (e.g., integrated circuits) are disposed and the shielding member 200 that covers at least a part of the one or more electric elements.

Referring to FIG. 4, the one or more electric elements 151 and 152 may include the first electric element 151 disposed in a shielding space 290 formed by the shielding member 200 and the second electric element 152 disposed outside the shielding space 290. The first electric element 151 disposed in the shielding space 290 may include a plurality of electric elements.

In the illustrated embodiment, the circuit board 150 may include a mounting region 1501 on which the electric elements 151 and 152 are mounted and a pad region 1502 that surrounds at least part of a peripheral portion of the mounting region 1501 and on which an adhesive material 154 for fixing the shielding member 200 is formed. For example, the adhesive material 154 may include a solder material.

Referring to FIG. 4, the shielding member 200 may include a plate 201 and a sidewall 202 extending along the periphery of the plate 201. The sidewall 202 may be fixed to the circuit board 150 by the adhesive material 154 formed on the circuit board 150.

In an embodiment, the sidewall 202 may include protrusions 210 protruding toward the circuit board 150 and recesses 230 formed between the protrusions 210. In this case, the adhesive material 154 included in the circuit board 150 may cover at least the protrusions 210 and the recesses 230 of the sidewall 202.

For example, the adhesive material 154 may be applied to the pad region 1502 of the circuit board 150 to surround one or more first electric elements 151, and the sidewall 202 of the shielding member 200 may be disposed on the circuit board 150 so as to correspond to the pad region 1502 of the circuit board 150. The sidewall 202 may be brought into contact with the adhesive material 154 formed on the pad region 1502. Thereafter, heat may be applied to the adhesive material 154 formed on the pad region 1502. At least part of the adhesive material 154 subjected to heat may be formed in a fluid state (e.g., a liquid state). The adhesive material 154 capable of flowing may adhere to opposite surfaces of the sidewall 202. Thereafter, the adhesive material 154 adhering to the opposite surfaces of the sidewall 202 may be solidified while cooling down. Accordingly, the adhesive material 154 may fix the sidewall 202 and the pad region 1502 of the circuit board 150.

Part of the adhesive material 154 may be formed between the sidewall 202 and the circuit board 150 (e.g., the pad region 1502). Part of the adhesive material 154 may be formed on the opposite surfaces of the sidewall 202. The adhesive force between the circuit board 150 and the shielding member 200 may be increased with an increase in the amount of the adhesive material 154 making contact with the circuit board 150 and the shielding member 200. However, when the amount of the adhesive material 154 is increased, the area of the pad region 1502 may be increased, and the area of the mounting region 1501 (e.g., the region on which the first electric elements 151 and the second electric element 152 are disposed) of the circuit board 150 may be decreased.

To increase the adhesive force between the circuit board 150 and the shielding member 200 and efficiently use the mounting region of the circuit board 150, the electronic device 100 according to an embodiment may provide the shielding member 200 including the sidewall 202 having a recess formed thereon for receiving the adhesive material 154. The adhesive material 154, at least part of which is molten (e.g., fused or melted), may infiltrate into the recess and may cool down, thereby improving the adhesive force between the circuit board 150 and the shielding member 200.

Hereinafter, in describing shielding members 200 of the electronic device according to embodiments, a direction of surrounding a shielding space 290 between a plate 201 and a circuit board 150 (e.g., an extension direction of a sidewall 202) will be referred to as a circumferential direction.

FIG. 5 is a view illustrating a shielding member of the electronic device according to an embodiment.

Referring to <501>, the shielding member 200 may include a plate 201 and a sidewall 202. The sidewall 202 may extend substantially perpendicular to the plate 201. The sidewall 202 may extend from the plate 201 to an adhesive material 154 included in a circuit board 150. Protrusions 210 may be formed on an end portion of the sidewall 202 that makes contact with the circuit board 150 or the adhesive material 154, and recesses 230 may be formed between the protrusions 210.

In the illustrated embodiment, one or more first recesses 221 may be formed on each of the protrusions 210. The first recesses 221 may be openings formed through the sidewall 202 and open in a direction toward the circuit board 150.

Referring to <502> and <503>, the sidewall 202 may include an inside surface 2202 facing toward a shielding space 290, an outside surface 2201 that faces toward the outside of the shielding space 290 and that is opposite to the inside surface 2202, and a support surface 2203 that is formed between the inside surface 2202 and the outside surface 2201 and that faces the circuit board 150. The adhesive material 154 may make contact with the outside surface 2201 and the inside surface 2202 included in the protrusion 210. At least part of the adhesive material 154 may be formed between the support surface 2203 included in the protrusion 210 and the circuit board 150.

In the illustrated embodiment, the first recesses 221 may be openings that are formed on the support surface 2203 through the outside surface 2201 of the sidewall 202 and the inside surface 2202 of the sidewall 202. Referring to an enlarged view illustrated in <501>, the first recesses 221 may have an increasing width toward the plate 201 from the support surface 2203 facing the circuit board 150. For example, each of the first recesses 221 may be formed by a bottom surface 2211 and inner sidewalls 2212 formed on opposite sides of the bottom surface 2211. The inner sidewalls 2212 may be spaced apart from each other by a first length L1 on the support surface 2203, and the bottom surface 2211 may extend by a second length L2 longer than the first length L1.

In various embodiments, the first recess 221 may be formed such that the gap between the inner sidewalls 2212 decreases from the bottom surface 2211 toward the circuit board 150. The adhesive material 154 may be received between the inner sidewalls 2213 and may prevent the shielding member 200 from being separated from the circuit board 150. Specifically, the adhesive material 154 may be formed in a fluid state (e.g., a liquid state) by heat applied thereto. The adhesive material 154 in the fluid state may be received between the inner sidewalls 2212. The adhesive material 154 received between the inner sidewalls 2212 may be solidified while cooling down. For example, when an impact is applied to the shielding member 200 in a direction in which the shielding member 200 moves away from the circuit board 150 (e.g., in an upper direction in the drawing), the adhesive material 154 may be supported by the inner sidewalls 2212 of the first recess 221 that have a decreasing gap toward the lower side of the first recess 221 (e.g., in the direction from the bottom surface 2211 of the first recess 221 toward the circuit board 150). Accordingly, the shielding member 200 may be prevented from being separated from the circuit board 150.

In various embodiments, the first recess 221 may include a first portion formed on the support surface 2203 and a second portion formed in the sidewall, and the first portion may be formed to be smaller than the second portion.

FIG. 6 is a view illustrating a shielding member of the electronic device according to an embodiment.

Referring to <601>, the shielding member 200 may include a plate 201 and a sidewall 202. The sidewall 202 may extend substantially perpendicular to the plate 201.

Referring to <602>, the sidewall 202 may extend from the plate 201 to an adhesive material 154 included in a circuit board 150. Protrusions 210 may be formed on an end portion of the sidewall 202 that makes contact with the circuit board 150 or the adhesive material 154, and recesses 230 may be formed between the protrusions 210. The recesses 230 may be spaced apart from the circuit board 150 at a first interval, and the protrusions 210 may be spaced apart from the circuit board 150 at a second interval smaller than the first interval. Alternatively, the protrusions 210 may be brought into contact with the circuit board 150.

Referring to <602>, the sidewall 202 may include an inside surface 2202 facing toward a shielding space 290, an outside surface 2201 that faces toward the outside of the shielding space 290 and that is opposite to the inside surface 2202, and a support surface 2203 that is formed between the inside surface 2202 and the outside surface 2201 and that faces the circuit board 150. The adhesive material 154 may make contact with the outside surface 2201 and the inside surface 2202 included in each of the protrusions 210. At least part of the adhesive material 154 may be formed between the support surface 2203 included in the protrusion 210 and the circuit board 150.

In the illustrated embodiment, a second recess 223 may be formed on the outside surface 2201 of the protrusion 210. The second recess 223 may extend along a circumferential direction of the sidewall 202 (e.g., an extension direction of the sidewall 202 surrounding the shielding space 290 between the plate 201 and the circuit board 150).

In the illustrated embodiment, the adhesive material 154 may extend from the circuit board 150 to cover at least part of the outside surface 2201 of the sidewall 202 and at least part of the inside surface 2202 of the sidewall 202. The adhesive material 154 may be received in the second recess 223 formed on the outside surface 2201. Referring to <601> and <602>, the second recess 223 is illustrated as being formed on the outside surface 2201 of the sidewall 202. However, without being limited thereto, the second recess 223 may be formed on the inside surface 2202 of the sidewall 202, or may be formed on both the outside surface 2201 and the inside surface 2202 of the sidewall 202.

Referring to <603>, a plurality of second recesses 223 may be formed on the outside surface 2201 and/or the inside surface 2202 of the sidewall 202. The plurality of second recesses 223 may extend along the circumferential direction of the sidewall 202. Even in the embodiment illustrated in <603>, the adhesive material 154 may extend from the circuit board 150 to cover at least part of the outside surface 2201 of the sidewall 202 and at least part of the inside surface 2202 of the sidewall 202. In this case, the adhesive material 154 may be received in all of the plurality of second recesses 223.

In the embodiments illustrated in FIG. 6, the molten adhesive material 154 in a liquid state may infiltrate into the recesses formed on the sidewall 202, and thus the contact area between the adhesive material 154 and the sidewall 202 may be increased. Accordingly, the adhesive force between the shielding member 200 and the adhesive material 154 may be improved, and the shielding member 200 may be prevented from being easily separated from the circuit board 150.

FIG. 7 is a view illustrating a shielding member of the electronic device according to an embodiment.

Referring to <701> and <702>, the shielding member 200 may include a plate 201 and a sidewall 202. The sidewall 202 may extend substantially perpendicular to the plate 201.

The sidewall 202 may extend from the plate 201 to an adhesive material 154 included in a circuit board 150. Protrusions 210 may be formed on an end portion of the sidewall 202 that makes contact with the circuit board 150 or the adhesive material 154, and recesses 230 may be formed between the protrusions 210. The recesses 230 may be spaced apart from the circuit board 150 at a first interval, and the protrusions 210 may be spaced apart from the circuit board 150 at a second interval smaller than the first interval. Alternatively, the protrusions 210 may be brought into contact with the circuit board 150.

Referring to <702>, the sidewall 202 may include an inside surface 2202 facing toward a shielding space 290, an outside surface 2201 that faces toward the outside of the shielding space 290 and that is opposite to the inside surface 2202, and a support surface 2203 that is formed between the inside surface 2202 and the outside surface 2201 and that faces the circuit board 150. The adhesive material 154 may make contact with the outside surface 2201 and the inside surface 2202 included in each of the protrusions 210. At least part of the adhesive material 154 may be formed between the support surface 2203 included in the protrusion 210 and the circuit board 150.

In the illustrated embodiment, a third recess 225 may be formed on the outside surface 2201 of the protrusion 210. The third recess 225 may extend along a circumferential direction of the sidewall 202 (e.g., the direction of surrounding the shielding space 290 between the plate 201 and the circuit board 150 in FIG. 4).

In the illustrated embodiment, the sidewall 202 may be curved such that the inside surface 2202 is convex toward the interior of the shielding space 290 and the outside surface 2201 is concave. The third recess 225 may include the outside surface 2201 formed to be concave. Unlike the second recess 223 illustrated in FIG. 6, the third recess 225 may include a curved surface. The third recess 225 may be formed by a process of pressing the sidewall 202.

In the illustrated embodiment, the adhesive material 154 may extend from the circuit board 150 to cover at least part of the outside surface 2201 of the sidewall 202 and at least part of the inside surface 2202 of the sidewall 202. The adhesive material 154 may be received in the third recess 225 formed on the outside surface 2201.

Referring to <701> and <702>, the third recess 225 is illustrated as being formed on the outside surface 2201 of the sidewall 202. However, without being limited thereto, the third recess 225 may be formed on the inside surface 2202 of the sidewall 202, or may be formed on both the outside surface 2201 and the inside surface 2202 of the sidewall 202.

In the embodiments illustrated in FIG. 7, the adhesive material 154 in a liquid state, at least part of which is molten, may be received in the recesses formed on the sidewall 202, and thus the contact area between the adhesive material 154 and the sidewall 202 may be increased. Thereafter, as the adhesive material 154 cools down, the adhesive material 154 received in the recesses may be solidified. Accordingly, the adhesive force between the shielding member 200 and the circuit board 150 may be increased, and the shielding member 200 may be prevented from being easily separated from the circuit board 150.

FIG. 8 is a view illustrating a shielding member of the electronic device according to an embodiment.

Referring to <801> and <802>, the shielding member 200 may include a plate 201 and a sidewall 202. The sidewall 202 may extend substantially perpendicular to the plate 201.

The sidewall 202 may extend from the plate 201 to an adhesive material 154 included in a circuit board 150. Protrusions 210 may be formed on an end portion of the sidewall 202 that makes contact with the circuit board 150 or the adhesive material 154, and recesses 230 may be formed between the protrusions 210. The recesses 230 may be spaced apart from the circuit board 150 at a first interval, and the protrusions 210 may be spaced apart from the circuit board 150 at a second interval smaller than the first interval. Alternatively, the protrusions 210 may be brought into contact with the circuit board 150.

Referring to <802>, the sidewall 202 may include an inside surface 2202 facing toward a shielding space 290, an outside surface 2201 that faces toward the outside of the shielding space 290 and that is opposite to the inside surface 2202, and a support surface 2203 that is formed between the inside surface 2202 and the outside surface 2201 and that faces the circuit board 150. The adhesive material 154 may make contact with the outside surface 2201 and the inside surface 2202 included in each of the protrusions 210. At least part of the adhesive material 154 may be formed between the support surface 2203 included in the protrusion 210 and the circuit board 150.

In the illustrated embodiment, one or more fourth recesses 227 may be formed on the outside surface 2201 of the protrusion 210. The plurality of fourth recesses 227 may be spaced apart from each other at predetermined intervals along a circumferential direction of the sidewall 202 (e.g., the direction of surrounding the shielding space 290 between the plate 201 and the circuit board 150 in FIG. 4).

In the illustrated embodiment, the adhesive material 154 may extend from the circuit board 150 to cover at least part of the outside surface 2201 of the sidewall 202 and at least part of the inside surface 2202 of the sidewall 202. The adhesive material 154 may be received in the fourth recesses 227 formed on the outside surface 2201.

Referring to <801> and <802>, fourth recesses 227a are illustrated as being formed on the outside surface 2201 of the sidewall 202. However, without being limited thereto, the fourth recesses 227a may be formed on the inside surface 2202 of the sidewall 202, or may be formed on both the outside surface 2201 and the inside surface 2202 of the sidewall 202.

As illustrated in <801>, the fourth recesses 227 may have a circular cross-section. As illustrated in <802>, the fourth recesses 227a may be formed in a conical shape. As illustrated in <803>, fourth recesses 227b may be formed in a spherical shape.

For example, the fourth recesses 227 illustrated in <802> may have a gradually decreasing diameter toward the shielding space 290 from the outside surface 2201 of the sidewall 202. For example, the outside surface 2201 of the sidewall 202 may be concavely recessed to form the fourth recesses 227b illustrated in <803>.

In the illustrated embodiment, the fourth recesses 227 formed on the outside surface 2201 of the sidewall 202 may vary depending on the shapes of tools used to form the fourth recesses 227. The cross-sectional shapes illustrated in <802> and <803> are illustrative, and the shielding member 200 of the electronic device 100 according to the embodiment of the disclosure may include the fourth recesses 227 having various cross-sectional shapes.

In the embodiments illustrated in FIG. 8, the adhesive material 154 may be received in the one or more fourth recesses 227 formed on the sidewall 202, and thus the contact area between the adhesive material 154 and the sidewall 202 may be increased. Accordingly, the adhesive force between the shielding member 200 and the circuit board 150 may be improved, and the shielding member 200 may be prevented from being easily separated from the circuit board 150.

FIG. 9 is a view illustrating a side member 200 of the electronic device 100 according to an embodiment. FIG. 10 is an enlarged view of a pattern region 240 illustrated in FIG. 9.

Referring to FIG. 9, a sidewall 202 of the shielding member 200 may include protrusions 210 and recesses 230 formed between the protrusions 210. Each of the protrusions 210 may include an inside surface 2202 facing toward a shielding space 290 and an outside surface 2201 opposite to the inside surface 2202. In the illustrated embodiment, the protrusion 210 may include the pattern region 240 formed on at least one of the outside surface 2201 or the inside surface 2202 of the protrusion 210.

Referring to FIG. 10, the pattern region 240 may include various forms of patterns.

Referring to FIG. 10 (a), the pattern region 240 may include a first pattern 241 extending in a circumferential direction of the sidewall 202 (e.g., the y-axis direction in the drawing). Referring to FIG. 10 (b), the pattern region 240 may include a second pattern 242 extending in a direction from a circuit board 150 to a plate 201 of the shielding member 200 (e.g., the z-axis direction in the drawing). Referring to FIGS. 10 (c) and (d), the pattern region 240 may include a third pattern 243 or a fourth pattern 244 that extends at a predetermined angle between the y-axis direction and the z-axis direction. Referring to FIG. 10 (e), the pattern region 240 may include a fifth pattern 245 formed at random.

In the illustrated embodiment, the pattern region 240 is illustrated as being formed on the outside surface 2201 of the protrusion 210. However, without being limited thereto, the pattern region 240 may be formed on the inside surface 2202 of the protrusion 210.

In various embodiments, the pattern region 240 may include at least one pattern among the first to fifth patterns 241, 242, 243, 244, and 245 illustrated in FIG. 10.

The shielding member 200 of the electronic device 100 according to various embodiments may include at least one of the patterns 241, 242, 243, 244, and 245 exemplarily illustrated in FIG. 10. An adhesive material 154 at least partially molten by heat applied thereto may be received in the pattern, and thus the contact area between the adhesive material 154 and the shielding member 200 may be increased. Accordingly, the shielding member 200 may be prevented from being easily separated from the circuit board 150.

Various embodiments of the disclosure and terms used herein are not intended to limit the technologies described in the disclosure to specific embodiments, and it should be understood that the embodiments and the terms include modification, equivalent, and/or alternative on the corresponding embodiments described herein. With regard to description of drawings, similar components may be marked by similar reference numerals. The terms of a singular form may include plural forms unless otherwise specified. In the disclosure disclosed herein, the expressions "A or B", "at least one of A and/or B", "A, B, or C", or "at least one of A, B, and/or C", and the like used herein may include any and all combinations of one or more of the associated listed items. Expressions such as "first," or "second," and the like, may express their components regardless of their priority or importance and may be used to distinguish one component from another component but is not limited to these components. When an (e.g., first) component is referred to as being "(operatively or communicatively) coupled with/to" or "connected to" another (e.g., second) component, it may be directly coupled with/to or connected to the other component or an intervening component (e.g., a third component) may be present.

According to the situation, the expression "adapted to or configured to" used herein may be interchangeably used as, for example, the expression "suitable for", "having the capacity to", "changed to", "made to", "capable of" or "designed to" in hardware or software. The expression "a device configured to" may mean that the device is "capable of" operating together with another device or other parts. For example, a "processor configured to (or set to) perform A, B, and C" may mean a dedicated processor (e.g., an embedded processor) for performing corresponding operations or a generic-purpose processor (e.g., a central processing unit (CPU) or an application processor (AP)) which performs corresponding operations by executing one or more software programs which are stored in a memory device.

The term "module" used herein may include a unit, which is implemented with hardware, software, or firmware, and may be interchangeably used with the terms "logic", "logical block", "part", "circuit", or the like. The "module" may be a minimum unit of an integrated part or a part thereof or may be a minimum unit for performing one or more functions or a part thereof. The "module" may be implemented mechanically or electronically and may include, for example, an application-specific IC (ASIC) chip, a field-programmable gate array (FPGA), and a programmable-logic device for performing some operations, which are known or will be developed.

At least a part of an apparatus (e.g., modules or functions thereof) or a method (e.g., operations) according to various embodiments may be, for example, implemented by instructions stored in a computer-readable storage media in the form of a program module. The instruction, when executed by a processor, may cause the processor to perform a function corresponding to the instruction. The computer-readable recording medium may include a hard disk, a floppy disk, a magnetic media (e.g., a magnetic tape), an optical media (e.g., a compact disc read only memory (CD-ROM) and a digital versatile disc (DVD), a magneto-optical media (e.g., a floptical disk)), an embedded memory, and the like. The one or more instructions may contain a code made by a compiler or a code executable by an interpreter.

Each component (e.g., a module or a program module) according to various embodiments may be composed of single entity or a plurality of entities, a part of the above-described sub-components may be omitted, or other sub-components may be further included. Alternatively or additionally, after being integrated in one entity, some components (e.g., a module or a program module) may identically or similarly perform the function executed by each corresponding component before integration. According to various embodiments, operations executed by modules, program modules, or other components may be executed by a successive method, a parallel method, a repeated method, or a heuristic method, or at least one part of operations may be executed in different sequences or omitted. Alternatively, other operations may be added.

The invention claimed is:

1. An electronic device comprising:
    a housing;
    a circuit board disposed inside the housing, the circuit board including a first electric element and an adhesive material; and
    a shielding member fixed to the circuit board by the adhesive material, the shielding member having a shielding space formed therein in which the first electric element is disposed,
    wherein the shielding member includes:
    a plate configured to face the circuit board; and
    a sidewall formed between the plate and the circuit board and extending in a circumferential direction of surrounding the shielding space,
    wherein the adhesive material is disposed on the circuit board to surround at least part of the sidewall,
    wherein the sidewall includes an inside surface configured to face toward the shielding space, an outside surface opposite to the inside surface, and a bottom surface configured to face the circuit board,
    wherein the sidewall includes a plurality of protrusions extending toward the circuit board and a plurality of grooves formed between the plurality of protrusions,
    wherein at least part of the adhesive material covers at least part of the outside surface and at least part of the inside surface, and
    wherein a recess is formed on the outside surface of each of the plurality of protrusions, and
    wherein the adhesive material is received in the recess and the plurality of grooves.

2. The electronic device of claim 1, wherein the adhesive material is conductive.

3. The electronic device of claim 1, wherein the adhesive material includes solder.

4. The electronic device of claim 1, wherein the plate substantially faces a first direction, and
    wherein the recess is formed in a direction perpendicular to the first direction.

5. The electronic device of claim 1, wherein the recess includes a first recess extending along the circumferential direction.

6. The electronic device of claim 1, wherein the recess includes a second recess extending in a direction substantially perpendicular to the circumferential direction.

7. The electronic device of claim 1, wherein the plurality of protrusions are spaced apart from each other at a predetermined intervals along the circumferential direction.

8. The electronic device of claim 1, wherein the shielding member contains a metallic material.

9. The electronic device of claim 1, wherein each of the outside surface and the inside surface of the sidewall includes a contact region with which the adhesive material is brought into contact.

10. The electronic device of claim 9, wherein the contact region is connected with the circuit board, and
    wherein the adhesive material extends from the circuit board to the contact region.

11. An electronic device comprising:
    a housing structure including a first cover, a second cover configured to face the first cover, and a side member configured to surround a space between the first cover and the second cover;
    a display disposed between the first cover and the second cover;
    a printed circuit board disposed between the display and the second cover, the printed circuit board having an electric element mounted thereon; and
    a shielding member fixed to the printed circuit board by a conductive adhesive material formed on the printed circuit board,
    wherein the shielding member includes a plate portion configured to face the printed circuit board and a sidewall portion configured to surround a shielding space between the plate portion and the printed circuit board,
    wherein the electric element is disposed in the shielding space,
    wherein the sidewall portion includes an inside surface configured to face toward the shielding space, an outside surface opposite to the inside surface, and a support surface supported by the printed circuit board,
    wherein one or more recesses are formed on the support surface, and the conductive adhesive material is received in the one or more recesses,
    wherein the one or more recesses include a bottom surface and inner sidewalls connected to opposite end portions of the bottom surface, and
    wherein a distance between the inner sidewalls increases as the inner sidewalls extending toward the printed circuit board.

12. The electronic device of claim 11, wherein the conductive adhesive material covers at least part of the inside surface of the sidewall portion and at least part of the outside surface of the sidewall portion.

\* \* \* \* \*